United States Patent
Toncich et al.

(10) Patent No.: US 7,221,243 B2
(45) Date of Patent: May 22, 2007

(54) APPARATUS AND METHOD FOR COMBINING ELECTRICAL SIGNALS

(75) Inventors: Stanley S. Toncich, San Diego, CA (US); Richard J. Camarillo, San Diego, CA (US)

(73) Assignee: Kyocera Wireless Corp., San Diego, CA (US)

( * ) Notice: Subject to any disclaimer, the term of this patent is extended or adjusted under 35 U.S.C. 154(b) by 20 days.

(21) Appl. No.: 10/974,391

(22) Filed: Oct. 26, 2004

(65) Prior Publication Data
US 2005/0057322 A1    Mar. 17, 2005

Related U.S. Application Data

(60) Continuation-in-part of application No. 10/120,938, filed on Apr. 10, 2002, now Pat. No. 7,164,329, and a continuation-in-part of application No. 09/927,136, filed on Aug. 10, 2001, now Pat. No. 6,825,818, which is a continuation-in-part of application No. 09/927,732, filed on Aug. 8, 2001, now Pat. No. 6,690,176, and a continuation-in-part of application No. 09/904,631, filed on Jul. 13, 2001, now Pat. No. 6,690,251, application No. 10/974,391, which is a continuation-in-part of application No. 10/685,239, filed on Oct. 14, 2003, now Pat. No. 6,885,263, which is a continuation of application No. 09/904,631, application No. 10/974,391, which is a continuation-in-part of application No. 10/750,304, filed on Dec. 31, 2003, now Pat. No. 6,927,644, which is a division of application No. 09/927,732.

(60) Provisional application No. 60/283,093, filed on Apr. 11, 2001.

(51) Int. Cl.
*H01P 1/20*    (2006.01)

(52) U.S. Cl. ..................................... 333/203; 333/206
(58) Field of Classification Search ................ 333/203, 333/206
See application file for complete search history.

(56) References Cited

U.S. PATENT DOCUMENTS 3,239,838 A    3/1966  Kelleher (Continued)

FOREIGN PATENT DOCUMENTS

DE    40 36 866    7/1991

(Continued)

OTHER PUBLICATIONS

Chandler, S.R. et al., "Active Varactor Tunable Bandpass Filter," IEEE Microwave and Guided Wave Letters, vol. 3, No. 3, Mar. 1993, pp. 70-71.

(Continued)

*Primary Examiner*—Robert Pascal
*Assistant Examiner*—Kimberly E Glenn

(57) ABSTRACT

An apparatus and method are presented for combining electrical signals. The apparatus includes a phase-shift distributed element with an input to accept a first signal and an output to supply the first signal with a phase-shift; and a filter with a first signal port connected to the phase-shift element output, a second signal port to accept a second signal, and a third signal port to supply combined and filtered first and second signals. The phase-shift element has a signal path with a predetermined length and the phase-shift element output supplies the first signal with a phase angle shift responsive to the length of the signal path. In one example, the phase-shift element is formed from monoblock and coaxial elements, either singly or in combination, and is a tank circuit resonator in the filter.

32 Claims, 9 Drawing Sheets

U.S. PATENT DOCUMENTS

| | | | |
|---|---|---|---|
| 3,413,543 A | 11/1968 | Schubring et al. | |
| 3,569,795 A | 3/1971 | Gikow | |
| 3,676,803 A | 7/1972 | Simmons | |
| 3,678,305 A | 7/1972 | George | |
| 3,680,135 A | 7/1972 | Boyer | |
| 3,737,814 A | 6/1973 | Pond | |
| 3,739,299 A | 6/1973 | Adler | |
| 3,836,874 A | 9/1974 | Maeda et al. | |
| 3,918,012 A | 11/1975 | Peuzin | |
| 4,122,400 A | 10/1978 | Medendorp et al. | |
| 4,236,125 A | 11/1980 | Bernard et al. | |
| 4,475,108 A | 10/1984 | Moser | |
| 4,484,157 A | 11/1984 | Helle et al. | |
| 4,494,081 A | 1/1985 | Lea et al. | |
| 4,525,720 A | 6/1985 | Corzine et al. | |
| 4,626,800 A | 12/1986 | Murakami et al. | |
| 4,733,328 A | 3/1988 | Blazej | |
| 4,736,169 A | 4/1988 | Weaver et al. | |
| 4,737,797 A | 4/1988 | Siwiak et al. | |
| 4,746,925 A | 5/1988 | Toriyama | |
| 4,792,939 A | 12/1988 | Hikita et al. | |
| 4,799,066 A | 1/1989 | Deacon | |
| 4,835,499 A | 5/1989 | Pickett | |
| 4,835,540 A | 5/1989 | Haruyama et al. | |
| 4,847,626 A | 7/1989 | Kahler et al. | |
| 4,924,195 A * | 5/1990 | Gonda | 331/116 R |
| 4,975,604 A | 12/1990 | Barta | |
| 5,166,857 A | 11/1992 | Avanic et al. | |
| 5,173,709 A | 12/1992 | Lauro et al. | |
| 5,212,463 A | 5/1993 | Babbitt et al. | |
| 5,216,392 A | 6/1993 | Fraser et al. | |
| 5,227,748 A | 7/1993 | Sroka | |
| 5,231,407 A | 7/1993 | McGirr et al. | |
| 5,293,408 A | 3/1994 | Takahashi et al. | |
| 5,307,033 A | 4/1994 | Koscica et al. | |
| 5,325,099 A | 6/1994 | Nemit et al. | |
| 5,388,021 A | 2/1995 | Stahl | |
| 5,406,163 A | 4/1995 | Carson et al. | |
| 5,416,803 A | 5/1995 | Janer | |
| 5,427,988 A | 6/1995 | Sengupta et al. | |
| 5,450,092 A | 9/1995 | Das | |
| 5,451,915 A | 9/1995 | Katzin et al. | |
| 5,459,123 A | 10/1995 | Das | |
| 5,472,935 A | 12/1995 | Yandrofski et al. | |
| 5,479,139 A | 12/1995 | Koscica et al. | |
| 5,495,215 A | 2/1996 | Newell et al. | |
| 5,496,795 A | 3/1996 | Das | |
| 5,496,796 A | 3/1996 | Das | |
| 5,499,002 A * | 3/1996 | Kinsman | 333/187 |
| 5,502,422 A | 3/1996 | Newell et al. | |
| 5,525,942 A | 6/1996 | Horii et al. | |
| 5,557,286 A | 9/1996 | Varadan et al. | |
| 5,561,307 A | 10/1996 | Mihara et al. | |
| 5,561,407 A | 10/1996 | Koscica et al. | |
| 5,564,086 A | 10/1996 | Cygan et al. | |
| 5,574,410 A | 11/1996 | Collins et al. | |
| 5,577,025 A | 11/1996 | Skinner | |
| 5,583,524 A | 12/1996 | Milroy | |
| 5,589,845 A | 12/1996 | Yandrofski | |
| 5,600,279 A | 2/1997 | Mori | |
| 5,617,104 A | 4/1997 | Das | |
| 5,640,042 A | 6/1997 | Koscica et al. | |
| 5,649,306 A | 7/1997 | Vanatta et al. | |
| 5,652,599 A | 7/1997 | Pitta et al. | |
| 5,673,188 A | 9/1997 | Lusher et al. | |
| 5,701,595 A | 12/1997 | Green, Jr. | |
| 5,721,194 A | 2/1998 | Yandrofski et al. | |
| 5,729,239 A | 3/1998 | Rao | |
| 5,777,524 A | 7/1998 | Wojewoda et al. | |
| 5,777,839 A | 7/1998 | Sameshina et al. | |
| 5,778,308 A | 7/1998 | Sroka et al. | |
| 5,830,591 A | 11/1998 | Sengupta et al. | |
| 5,834,975 A | 11/1998 | Bartlett et al. | |
| 5,864,932 A | 2/1999 | Evans et al. | |
| 5,870,670 A | 2/1999 | Ripley | |
| 5,880,921 A | 3/1999 | Tham et al. | |
| 5,892,486 A | 4/1999 | Cook et al. | |
| 5,908,811 A | 6/1999 | Das | |
| 5,910,994 A | 6/1999 | Lane et al. | |
| 5,945,887 A | 8/1999 | Makino et al. | |
| 5,965,494 A | 10/1999 | Terashima et al. | |
| 5,973,567 A | 10/1999 | Heal et al. | |
| 5,973,568 A | 10/1999 | Shapiro et al. | |
| 5,986,515 A | 11/1999 | Sakurai | |
| 5,987,314 A | 11/1999 | Saito | |
| 5,990,766 A | 11/1999 | Zhan et al. | |
| 6,008,659 A | 12/1999 | Traynor | |
| 6,018,282 A | 1/2000 | Tsuda | |
| 6,020,787 A | 2/2000 | Kim et al. | |
| 6,026,311 A | 2/2000 | Willemsen Cortes et al. | |
| 6,028,561 A | 2/2000 | Takei | |
| 6,049,726 A | 4/2000 | Gruenwald et al. | |
| 6,052,036 A | 4/2000 | Enstrom et al. | |
| 6,054,908 A | 4/2000 | Jackson | |
| 6,094,588 A | 7/2000 | Adam | |
| 6,097,263 A | 8/2000 | Mueller et al. | |
| 6,101,102 A | 8/2000 | Brand et al. | |
| 6,108,191 A | 8/2000 | Bruchhaus et al. | |
| 6,160,524 A | 12/2000 | Wilber | |
| 6,181,777 B1 | 1/2001 | Kiko | |
| 6,198,441 B1 | 3/2001 | Okabe | |
| 6,216,020 B1 | 4/2001 | Findikoglu | |
| 6,242,843 B1 | 6/2001 | Pohjonen et al. | |
| 6,272,336 B1 | 8/2001 | Appel et al. | |
| 6,278,383 B1 | 8/2001 | Endo et al. | |
| 6,281,023 B2 | 8/2001 | Eastep et al. | |
| 6,281,534 B1 | 8/2001 | Arita et al. | |
| 6,285,337 B1 | 9/2001 | West et al. | |
| 6,292,143 B1 | 9/2001 | Romanofsky | |
| 6,294,964 B1 | 9/2001 | Satoh | |
| 6,308,051 B1 | 10/2001 | Atokawa | |
| 6,327,463 B1 | 12/2001 | Welland | |
| 6,329,959 B1 | 12/2001 | Varadan et al. | |
| 6,333,719 B1 | 12/2001 | Varadan | |
| 6,335,710 B1 | 1/2002 | Falk et al. | |
| 6,344,823 B1 | 2/2002 | Deng | |
| 6,359,444 B1 | 3/2002 | Grimes | |
| 6,362,784 B1 | 3/2002 | Kane et al. | |
| 6,362,789 B1 | 3/2002 | Trumbull et al. | |
| 6,384,785 B1 | 5/2002 | Kamogawa et al. | |
| 6,404,304 B1 | 6/2002 | Kwon et al. | |
| 6,456,236 B1 | 9/2002 | Hauck et al. | |
| 6,462,628 B2 | 10/2002 | Kondo et al. | |
| 6,489,860 B1 | 12/2002 | Ohashi | |
| 6,503,786 B2 | 1/2003 | Klodzinski | |
| 6,518,850 B1 | 2/2003 | Falk et al. | |
| 6,518,920 B2 | 2/2003 | Proctor, Jr. et al. | |
| 6,522,220 B2 | 2/2003 | Yamada et al. | |
| 6,525,630 B1 | 2/2003 | Zhu et al. | |
| 6,525,691 B2 | 2/2003 | Varadan et al. | |
| 6,531,936 B1 | 3/2003 | Chiu et al. | |
| 6,559,737 B1 | 5/2003 | Nagra et al. | |
| 6,571,110 B1 | 5/2003 | Patton et al. | |
| 6,600,456 B2 | 7/2003 | Gothard et al. | |
| 6,653,977 B1 | 11/2003 | Okabe et al. | |
| 6,667,723 B2 | 12/2003 | Forrester | |
| 6,686,817 B2 | 2/2004 | Zhu et al. | |
| 6,721,293 B1 | 4/2004 | Komulainen et al. | |
| 6,727,535 B1 | 4/2004 | Sengupta et al. | |
| 6,819,203 B2 | 11/2004 | Taniguchi | |
| 6,842,086 B1 | 1/2005 | Zennamo, Jr. | |
| 2001/0026243 A1 | 10/2001 | Koitsalu et al. | |
| 2001/0043159 A1 | 11/2001 | Masuda et al. | |
| 2002/0049064 A1 | 4/2002 | Banno | |

| | | | |
|---|---|---|---|
| 2002/0093400 A1 | 7/2002 | Zhu et al. | |
| 2002/0149526 A1 | 10/2002 | Tran et al. | |
| 2002/0149535 A1 | 10/2002 | Toncich | |
| 2002/0175878 A1 | 11/2002 | Toncich | |
| 2003/0062971 A1 | 4/2003 | Tonich | |
| 2003/0134665 A1 | 7/2003 | Kato et al. | |
| 2004/0087280 A1 | 5/2004 | Watanabe et al. | |
| 2004/0162047 A1 | 8/2004 | Kasahara et al. | |
| 2004/0196121 A1 | 10/2004 | Toncich | |
| 2004/0212457 A1 | 10/2004 | Eden et al. | |
| 2004/0263411 A1 | 12/2004 | Fabrega-Sanchez et al. | |
| 2005/0007291 A1 | 1/2005 | Fabrega-Sanchez et al. | |

FOREIGN PATENT DOCUMENTS

| | | |
|---|---|---|
| DE | 100 24 483 | 11/2001 |
| DE | 101 37 753 | 2/2003 |
| EP | 0 125 586 | 11/1984 |
| EP | 0 346 089 | 12/1989 |
| EP | 0 473 373 | 3/1992 |
| EP | 0 531 125 | 3/1993 |
| EP | 0 631 399 | 12/1994 |
| EP | 0 637 131 | 2/1995 |
| EP | 0 680 108 | 11/1995 |
| EP | 0 795 922 | 9/1997 |
| EP | 0 854 567 | 7/1998 |
| EP | 0 872 953 | 10/1998 |
| EP | 0 881 700 | 12/1998 |
| EP | 0 892 459 | 1/1999 |
| EP | 0 909 024 | 4/1999 |
| EP | 1 043 741 | 10/2000 |
| EP | 1 058 333 | 12/2000 |
| EP | 1 248 317 | 10/2002 |
| GB | 2 240 227 | 7/1991 |
| JP | 63 128618 | 6/1988 |
| JP | 05182857 | 7/1993 |
| JP | 2001 338839 | 12/2001 |
| WO | WO 82/03510 | 10/1982 |
| WO | WO 94/27376 | 11/1994 |
| WO | WO 00/35042 | 6/2000 |
| WO | WO 00/62367 | 10/2000 |
| WO | WO 03/58759 | 7/2001 |
| WO | WO 02/084798 | 10/2002 |

OTHER PUBLICATIONS

Chang, C. et al., "Microwave Active Filters Based on Coupled Negative Resistance Method," IEEE Trans. on Microwave Theory & Techs., vol. 38, No. 12, Dec. 1990, pp. 1879-1884.

Cohn, S.B., "Dissipation Loss in Multiple-Coupled-Resonator Filters," Proc. IRE 47, Aug. 1959, pp. 1342-1348.

Cuthbert, T., "Broadband Impedance Matching -Fast and Simple", RF Design, Cardiff Publishing Co., vol. 17, No. 12, Nov. 1994, pp. 38, 42, 44, 48, XP000477834.

Dishal, M., "Alignment and Adjustment of Synchronously Tuned Multiple Resonator-Circuit Filters," Proc. IRE 39, Nov. 1951, pp. 1448-1455.

Erker et al., "Monolithic Ka-Band Phase Shifter Using Voltage Tunable BaSrTiO3 Parallel Plate Capacitors", IEEE Microwave and Guided Wave Letters, IEEE Inc., vol. 10, No. 1, Jan. 2000, pp. 10-12 XP-000930368.

Fubini, E.G. et al., "Minimum Insertion Loss Filters," Proc. IRE 47, Jan. 1959, pp. 37-41.

Fujita, K. et al., "A 15.6 GHz Commercially Based 1/8 GaAs Dynnamic Presealer," 1989 IEEE GaAs IC Symposium, pp. 113-116.

Galt, D. et al., "Ferroelectric Thin Film Characterization Using Superconducting Microstrip Resonators", IEEE Trans on Appl Superconductivity Jun. 1995 IEEE, pp. 2575-2578, vol. 5, No. 2, Piscataway, NJ, USA.

Getsinger, W.J., "Prototypes for Use in Broadbanding Reflection Amplifiers," IEEE Trans. PTGMTT-11, Nov. 1963, pp. 486-497.

Getsinger, W.J et al., "Some Aspects of the Design of Wide-Band Up-Converters and Nondegenerate Parametric Amplifiers," IEEE Trans. PTGMTT-12, Jan. 1964, pp. 77-87.

Gevorgian, Spartak S. et al., "HTS/Ferroelectric Devices for Microwave Applications", IEEE Transactions on Applied Superconductivity, Jun. 1997, pp. 2458-2461, IEEE, USA.

Hopf, B. et al., "Coplanar MMIC Active Bandpass Filters Using Negative Resistance Circuits," 1994 IEEE MTT-S Symposium Digest, pp. 1183-1185.

Hunter, I.C. et al., "Electronically Tunable Microwave Bandpass Filters," IEEE Trans. on MTT, vol. 30, No. 9, Sep. 1982, pp. 1354-1367.

Jose et al., "Experimental investigations on electronically tunable microstrip antennas," Feb. 5, 1999, Microwave and optical technology letters, vol. 20, No. 3, pp. 166-169.

Kapilevich, B., "Understand the Operation and Channelized Active Filters," Microwaves & RF, Jan. 1997, pp. 89-92.

Kapilevich, B., "Variety of Approaches to Designing Microwave Active Filters," Proc. 27th European Microwave Conference, Jerusalem, vol. 1, 1997, pp. 397-408.

Karacaoglu, U. et al., "High Selectivity Varactor-Tuned MMIC Bandpass Filter Using Lossless Active Resonators," 1994 IEEE MTT-Symposium Digest, pp. 1191-1194.

Katzin, P. et al., "Narrow-band MMIC Filters with Automatic Tuning and Q-Factor Control," 1993 IEEE MTT-S Int. Microwave Symposium Digest, pp. 403-406.

Keis, V. N. et al., "20GHz tunable filter based on ferroelectric (BaSr)TiO3 film varactors", Electronics Letters, May. 28, 1998, vol. 34, No. 11, IEE Stevenage, GB.

Kotzebue, K.L., "Broadband Electronically-Tunable Microwave Filters," 1960 IRE Wescon Convention Record, Part 1, pp. 21-27.

Kozyrev, A., et al., "Ferroelectric Films: Nonlinear Properties and Applications in Microwave Devices", 1998 IEEE MTT-S Digest, May 1998, pp. 985-988, 1998 IEEE MTT-S Intl Baltimore, MD, USA, IEEE, USA.

Krautkramer, V.W. et al., "Resonanztransformatoren mit drei Reaktanzen als transformierende Filter", Bulletin des Schweizerischen Elektrotechnischen Vereins, Zurich, CH, vol. 64, No. 23, Nov. 10, 1973, pp. 1500-1509, XP002184530.

Kuh, E.S. et al., "Optimum Synthesis of Wide-Band Parametric Amplifiers and Converters," IRE Trans. PCCT-8, Dec. 1961, pp. 410-415.

Louhos, J.P. et al., "Electrical Tuning of Integrated Mobile Phone Antennas," Nokia Mobile Phones, pp. 69-97 (Sep. 15, 1999).

Makioka, S. et al., "A High Efficiency GaAs MCM Power Amplifier for 1.9 GHz Digital Cordless Telephones," IEEE 1994 Microwave & Millimeter-Wave Monolithic Cir. Sym., pp. 51-54.

Matthaei, G.L., "An Electronically Tunable Up-Converter," Proc. IRE 49, Nov. 1961, pp. 1703-1704.

Nauta, B., "A CMOS Transconductance-C Filter Technique for Very High Frequencies," IEEE Journal of Solid-State Circuits, vol. 27, No. 2, Feb. 1992, pp. 142-153.

Panayi, P.K. et al., "Tuning Techniques for the Planar Inverted-F Antenna," National Conference on Antennas and Propagation Publication, No. 461, pp. 259-262, (Apr. 1999).

Presser, A., "Varactor-Tunable, High-Q Microwave Filter," RCA Review, vol. 42, Dec. 1981, pp. 691-705.

Sleven, R.L., "Design of a Tunable Multi-Cavity Waveguide Band-Pass Filter," 1959 IRE National Convention Record, Part 3, pp. 91-112.

Smuk, J. et al., "MMIC Phase Locked L-S Band Oscillators," 1994 IEEE GaAs Symposium Digest, pp. 27-29.

Taub, J.J. et al., "Design of Three-Resonator Dissipative Band-Pass Filters Having Minimum Insertion Loss," Proc. IRE 45, pp. 681-687 (May 1957).

Toncich et al., "Data Reduction Method for Q Measurements of Stripline Resonators", IEEE Transactions in MTT, vol. 40, No. 9, Sep. 1992, pp. 1833-1836.

Toyoda, S., "Quarter-wavelength Coupled Variable Bandstop and Bandpass Filters Using Varactor Diodes," IEEE Trans. on MTT, vol. 30, No. 9, Sep. 1982, pp. 1387-1389.

Varadan, V.K. et al., "Design and Development of Electronically Tunable Microstrip Antennas," IOP Publishing Ltd., pp. 238-242, (1999).

Vendik, O.G. et al., "1GHz tunable resonator on bulk single crystal SrTiO3 plated with Yba2Cu307-x films", Electronics Letters, Apr. 13, 1995, pp. 654-656, vol. 31, No. 8, IEE Stevenage, GB.

* cited by examiner

APPARATUS AND METHOD FOR COMBINING ELECTRICAL SIGNALS

RELATED APPLICATIONS

This application is a continuation-in-part of U.S. application Ser. No. 09/927,136, filed Aug. 10, 2001, now U.S. Pat. No. 6,825,818, which claims the benefit of Prov. App. No. 60/283,093, filed Apr. 11, 2001. This application is also a continuation-in-part of U.S. application Ser. No. 10/120,938, filed Apr. 10, 2002, now U.S. Pat. No. 7,164,329, which is a continuation-in-part of application Ser. No. 09/927,732, filed Aug. 8, 2001, now U.S. Pat. No. 6,690,176, which claims the benefit of Prov. App. No. 60/283,093, filed Apr. 11, 2001. U.S. application Ser. No. 10/120,938 is further a continuation-in-part of U.S. application Ser. No. 09/904,631, filed Jul. 13, 2001, now U.S. Pat. No. 6,690,251, which claims the benefit of Prov. App. No. 60/283,093, filed Apr. 11, 2001. This application is also a continuation-in-part of U.S. application Ser. No. 10/685,239, filed Oct. 14, 2003, now U.S. Pat. No. 6,885,263, which is a continuation of U.S. application Ser. No. 09/904,631, filed Jul. 13, 2001, now U.S. Pat. No. 6,690,251, which claims the benefit of Prov. App. No. 60/283,093, filed Apr. 11, 2001. This application is also a continuation-in-part of U.S. application Ser. No. 10/750,304, filed Dec. 31, 2003, now U.S. Pat. No. 6,927,644, which is a divisional of U.S. application Ser. No. 09/927,732, filed Aug. 8, 2001, now U.S. Pat. No. 6,690,176, which claims the benefit of U.S. Prov. App. No. 60/283,093, filed Apr. 11, 2001.

BACKGROUND OF THE INVENTION

1. Field of the Invention

This invention generally relates to signal processing and, more particularly, to an apparatus and method for phase-shifting, combining, and filtering electrical signals.

2. Description of the Related Art

FIG. 8 is a schematic diagram of a conventional lumped element, dual input-single output system in a wireless communications device. A wireless communications device will be used to illustrate the phase-shifting, combining, and filtering of communications signals. However, it is understood that the following discussion is applicable to a wide variety of electronic devices and signals. In a wireless communications device, a lumped element circuit, as shown in FIG. 8, can be used to phase-shift input signal A and to combine and filter phase-shifted signal A and input signal B to produce an output signal. In FIG. 8, lumped element transformers and energy-storage devices, such as capacitors, are used to process the input signals. In one instance, for a Code Division Multiple Access (CDMA) wireless device, the transformers are driven in and out of saturation to produce a CDMA waveform at the system output.

Unfortunately, there are disadvantages associated with the lumped element system in FIG. 8. The lumped element system is only effective for signal frequencies up to approximately 200 MHz. Beyond this frequency, the system becomes excessively lossy. In general, lumped elements also are larger and more expensive than other types of elements, for example, distributed elements. Advances in technology and manufacturing techniques permit wireless communications devices to be made increasingly smaller, which in turn, creates a need to reduce the space required for components in the devices by reducing the number and/or size of the components. Unfortunately, as noted above, lumped elements tend to be relatively larger. The subsequent increase in space usage can limit the size to which a wireless device can be reduced, or can limit space available in the wireless device for other components.

It would be advantageous if a system could efficiently phase-shift, combine, and filter signals at frequencies greater than 200 MHz.

It would be advantageous to reduce the size and cost of a system to phase-shift, combine, and filter signals.

SUMMARY OF THE INVENTION

The present invention addresses operations on electrical signals. The invention recognizes that electrical signals, in particular, communications signals, require phase-shifting, combining, and filtering at higher frequencies while using minimal space in a respective device. The invention addresses these problems by using a distributed element to phase-shift signals.

Accordingly, a system is provided for combining electrical signals. The system includes a phase-shift distributed element with an input to accept a first signal and an output to supply the first signal with a phase shift. The system also includes a filter with a first signal port connected to the phase-shift distributed element output, a second signal port to accept a second signal, and a third signal port to supply combined and filtered first and second signals. The phase-shift distributed element has a signal path with a predetermined length and a characteristic impedance. The phase-shift distributed element output supplies the first signal with a phase angle shift responsive to the length of the signal path. In one example, the phase-shift distributed element is formed from monoblock and coaxial elements, either singly or in combination, and is a first tank circuit resonator in the filter. The filter may also include another monoblock or a coaxial element used as a second tank circuit resonator. In some cases, the system includes a ferroelectric variable capacitor operatively connected to the phase-shift distributed element.

Additional details of the above-described system, and a method for combining electrical signals are provided below.

DETAILED DESCRIPTION OF THE PREFERRED EMBODIMENTS

Figure 1:
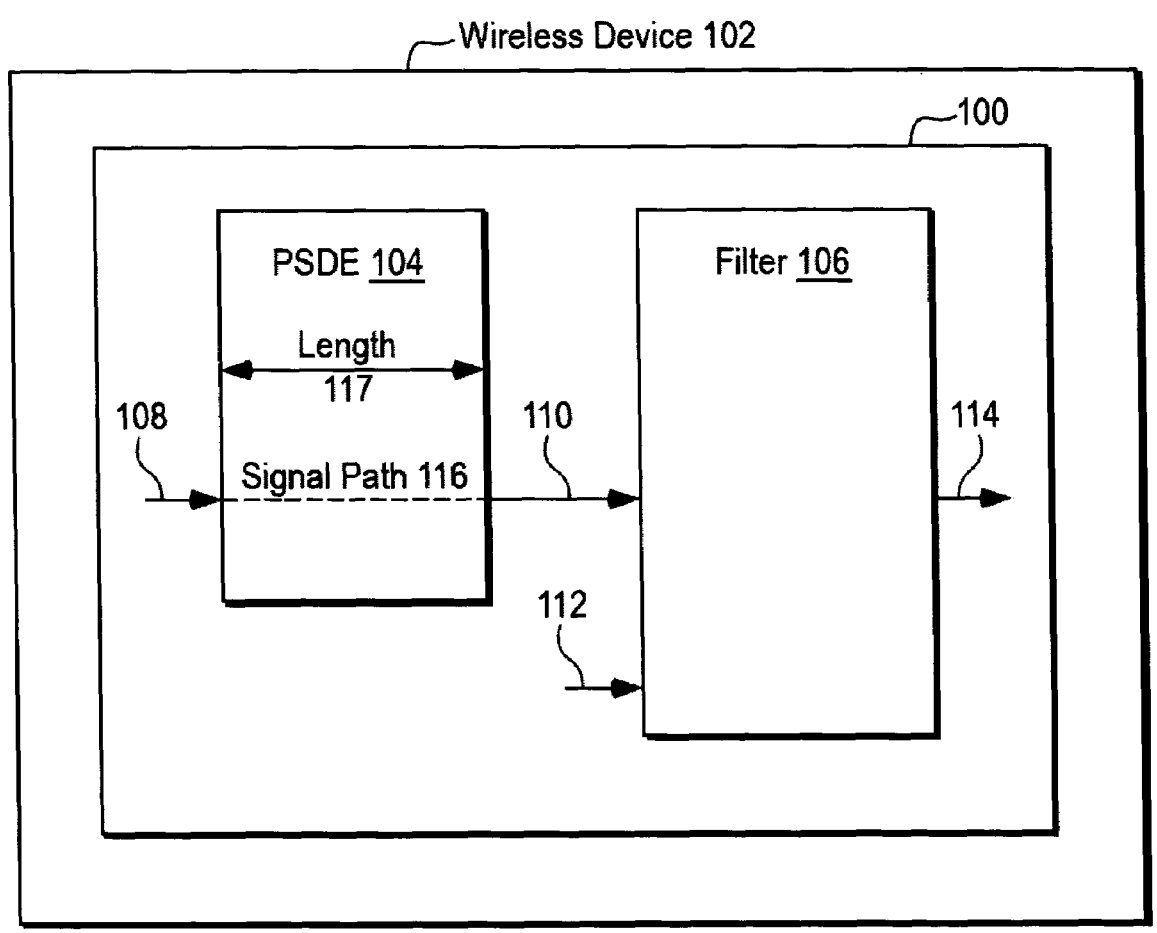
FIG. 1 is a schematic block diagram depicting the system for combining electrical signals.

FIG. 1 is a schematic block diagram depicting the system 100 for combining electrical signals. In FIG. 1, system 100 is shown in wireless device 102 for purposes of illustration. However, it should be understood that the system 100 is applicable to a wide range of electrical devices generating, accepting, and processing electrical signals. System 100 includes a phase-shift distributed element (PSDE) 104 and a filter 106. The PSDE 104 has an input to accept a first signal on line 108 and an output to supply the first signal with a phase-shift on line 110. For the PSDE 104, distributed element can be defined as a transmission line. That is, conductive connections carrying signal power between the PSDE 104 input and output. Coaxial cable, stripline, microstrip, and waveguide are general examples of transmission lines. Specific examples are given below. Lumped elements can have capacitive or inductive impedances; however, distributed elements are typically inductive. Distributed elements have a relatively low loss compared to lumped elements.

The filter 106 includes a first signal port to accept the phase-shifted first signal on line 110, a second signal port to accept a second signal on line 112, and a third signal port to supply combined and filtered phase-shifted first signals and second signals on line 114.

The PSDE 104 has a signal path 116 with a predetermined length 117 and a characteristic impedance. The PSDE 104 supplies the first signal on line 110 with a phase angle shift responsive to the length 117. As noted above, the PSDE 104 can act on the first signal as if it were a low-loss lumped component. Specifically, the PSDE 104 acts as an inductor with an inductance increasing as length 117 increases. Alternately stated, the PSDE acts in the same way as a transmission line "moving" a source impedance around the characteristic impedance of a Smith Chart with positive (clockwise) susceptance. In general, the distributed element inductance of PSDE 104 causes the phase shift of the signal on line 108.

Figure 2A:
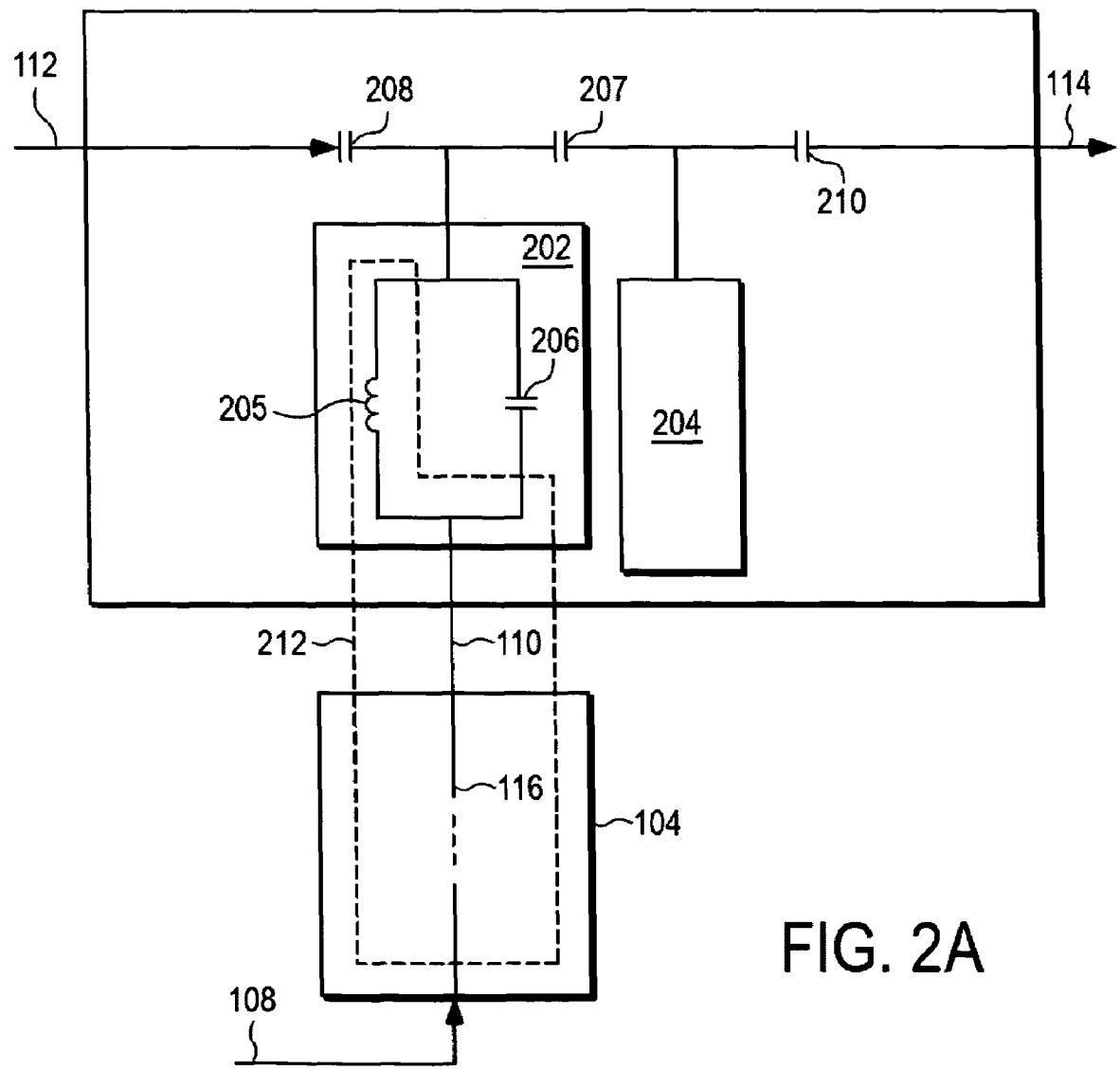
FIGS. 2A and 2B are simplified circuit diagrams for the system shown in FIG. 1.
Figure 2B:
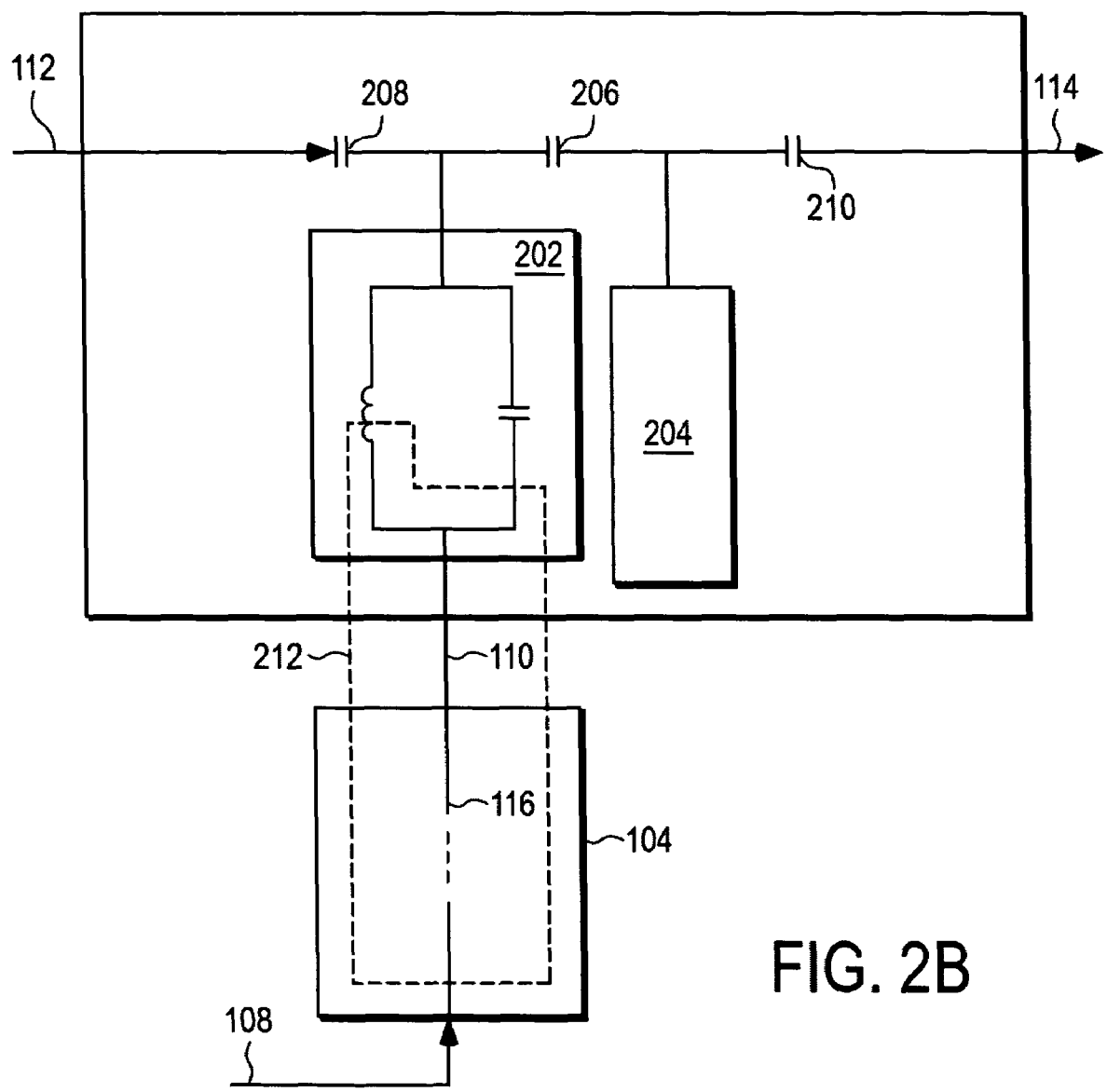

FIGS. 2A and 2B are simplified circuit diagrams for the system 100 shown in FIG. 1. FIGS. 2A and 2B include resonators 202 and 204 which establish the resonant frequency for the filter 106 and hence, the pass band for the filter 106. In some aspects of the system 100, the filter 106 includes a resonator 212 formed from the PSDE 104. In this case, the signal path 116 in the PSDE 104 forms part of the signal path for the resonator 212. The resonator 212 performs both the phase shifting of the first signal and the functions of the resonator 202. Therefore, the resonator 202 of FIGS. 2A and 2B can be thought of as being included in resonator 212. The resonator 212 is shown as a tank circuit with an inductor 205 in parallel with a capacitor 206. The resonators 202 and 204 are connected by coupling capacitor 207. The circuit also includes input capacitor 208 and output capacitor 210. This basic filter topography is applicable to a wide range of filter types, such as Butterworth and Chebychev. The type of filter is determined, in part, by the values selected for the capacitors 207, 208, and 210. Neither is the filter limited to any particular number of poles.

FIG. 2A shows the case is which the inductor 205 and the PSDE 104 are the same inductor. That is, the PSDE 104 supplies the inductance for the resonator 212. FIG. 2B shows the case is which only a portion of the inductor 205 is included in the PSDE 104. That is, the PSDE 104 only supplies a portion of the inductance for resonator 212.

Figure 3:
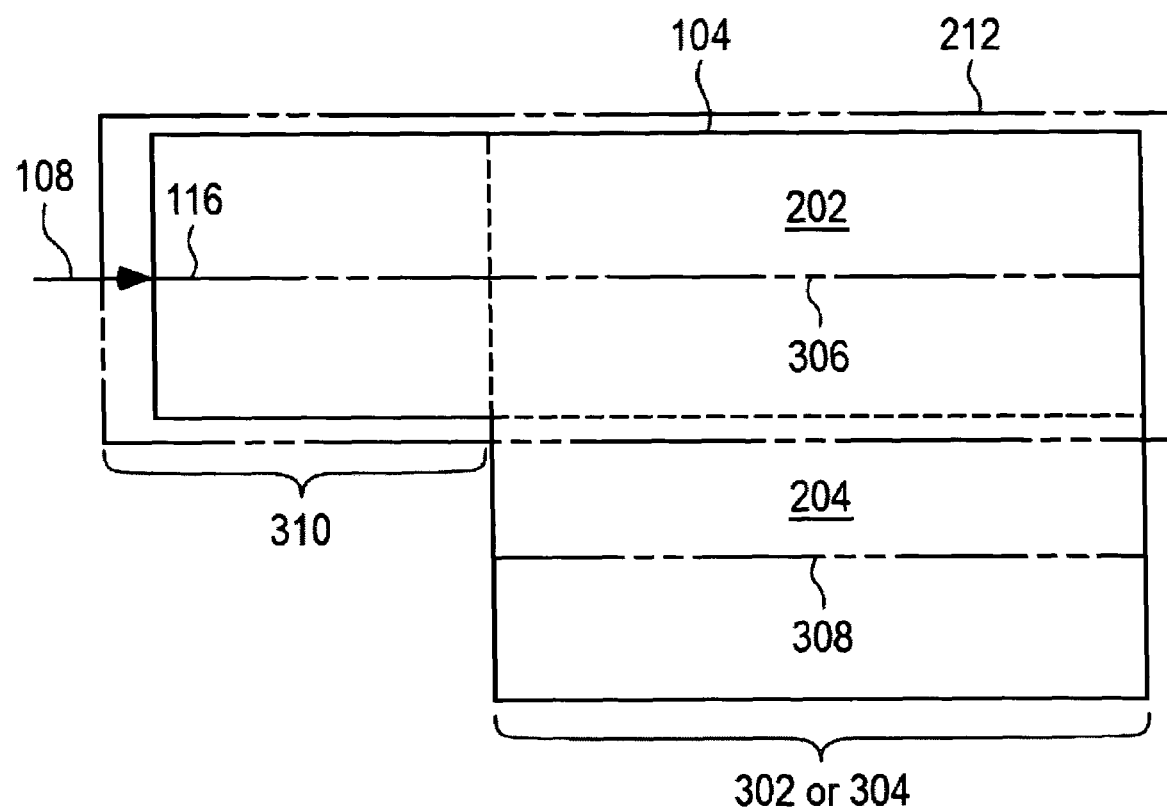
FIG. 3 is a schematic block diagram depicting the PSDE including both filter resonators.

FIG. 3 is a schematic block diagram depicting the PSDE 104 including both filter 106 resonators. As shown in FIG. 3, in some aspects of the system 100, the PSDE 104 includes the resonators 202 and 204. In FIG. 3, the resonators 202 and 204 are formed in a single combined monoblock element 302 or a single combined coaxial element 304. In other words, monoblock element 302 and coaxial element 304 are each a single block of dielectric material forming resonators 202 and 204. Typically, this material is a ceramic. In the case of coaxial element 304, the ceramic, or other dielectric material, is typically sheathed in a conductive layer (not shown). In this configuration, resonator 202 has a center conductor 306 and resonator 204 has a center conductor 308. The single block configuration of elements 302 and 304 will be used for the figures that follow. However, it is understood that the resonators 202 and 204 also could be formed in separate blocks of dielectric material (not shown). The line 110, shown supplying the phase-shifted first signal to the filter 106 in FIG. 1, can be considered internal to the resonator 212 and, thus, is not shown in FIG. 3 or the figures that follow.

In FIG. 3, the resonator 212 is formed by an extension 310 of the material forming the monoblock element 302 or the coaxial element 304. The extension 310 has a length approximately equal to length 117. As configured, the resonators in coaxial element 304 are formed by connecting the coax elements 202 and 204, with one or more coupling capacitors (not shown), to ground, forming LC tank elements with a high impedance at the filter 106 passband frequency. The resonator 212 also can be formed by connecting a separate resonator element (not shown) with a length approximately equal to length 117 to the resonator 202. The use of a separate element is described below in the explanation of FIGS. 4A and 4B.

Figure 4A:
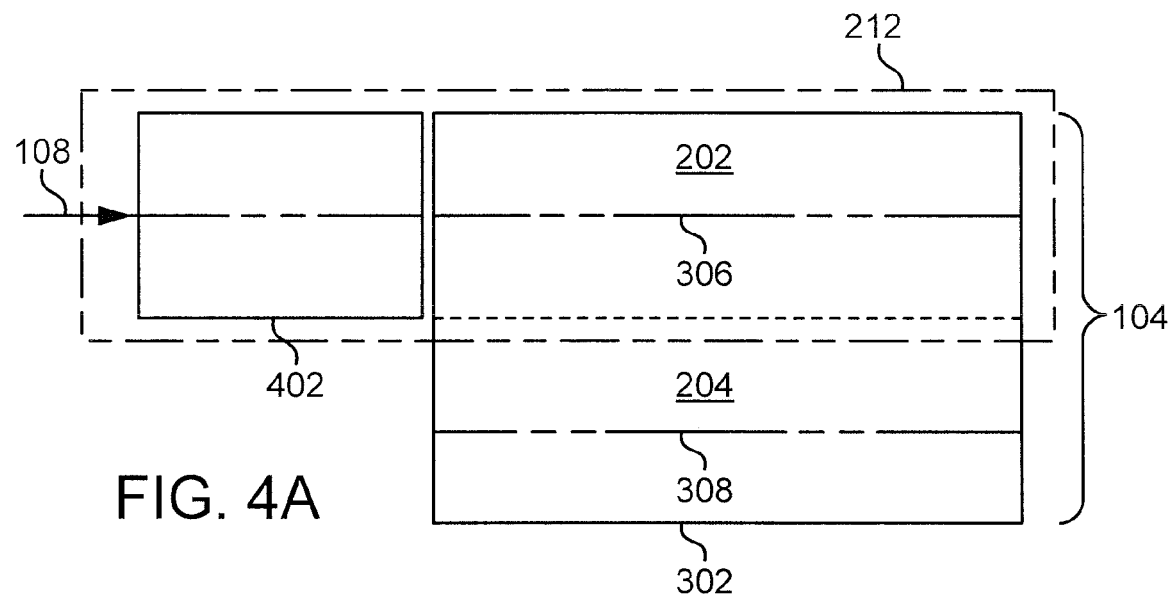
FIGS. 4A and 4B are schematic block diagrams depicting the use of a separate coaxial extension element in the PSDE.
Figure 4B:
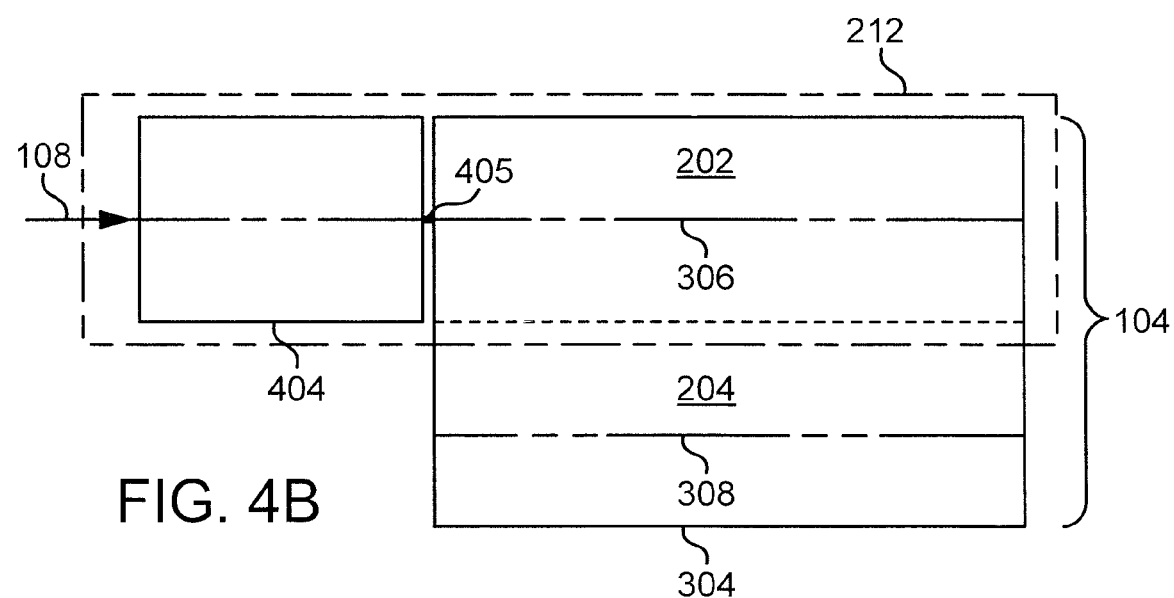

FIGS. 4A and 4B are schematic block diagrams depicting the use of a separate coaxial extension element in the PSDE 104. In FIGS. 4A and 4B, the PSDE 104 includes the monoblock element 302 or the coaxial element 304, respectively. In FIG. 4A, the resonator 212 is formed by connecting a coaxial extension 402 in series with monoblock element 302. In some aspects, a pin (not shown) is used to connect monoblock element 302 with coaxial extension 402. In some aspects, a wire bond (not shown) is used to connect monoblock element 302 with coaxial extension 402.

In FIG. 4B, resonator 212 is formed by connecting a coaxial extension 404 in series with coaxial element 304. In some aspects, a pin or a wire bond 405 is used to connect coaxial element 304 with coaxial extension 404.

For the configurations shown in FIGS. 4A and 4B, the PSDE 104 may be fully included in the monoblock element 302 or the coaxial element 304, respectively, and the applicable coaxial extension. However, it should be understood that alternate configurations also are encompassed by system 100. For example, the coaxial extensions 402 or 404 can be configured such that components in the extensions 402 or 404 are not part of the resonator 212. That is, portions of the coaxial extensions 402 or 404 are not operatively connected to the resonator 212.

Figure 5A:
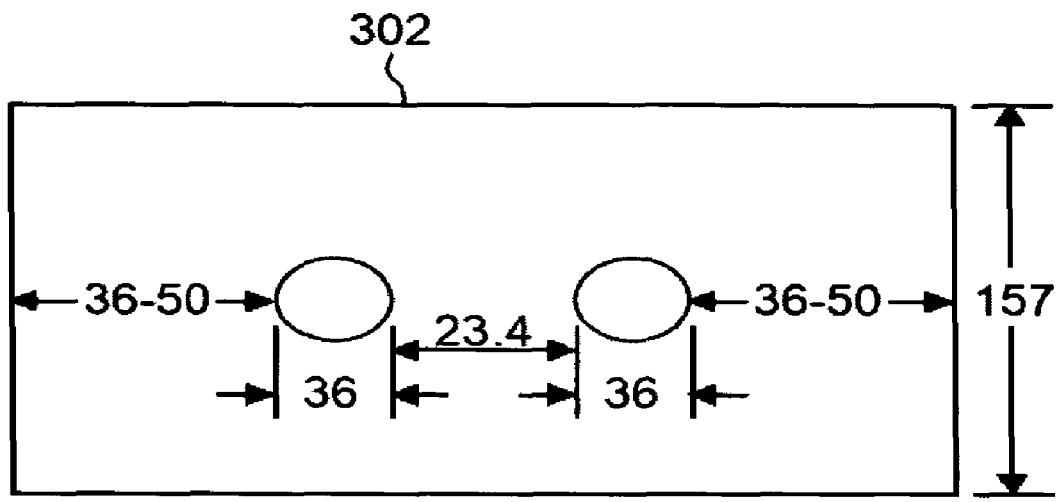
FIGS. 5A and 5B are partial cross-sectional drawings depicting dimensions for the monoblock element and the coaxial extension, respectively, shown in FIG. 4A.
Figure 5B:
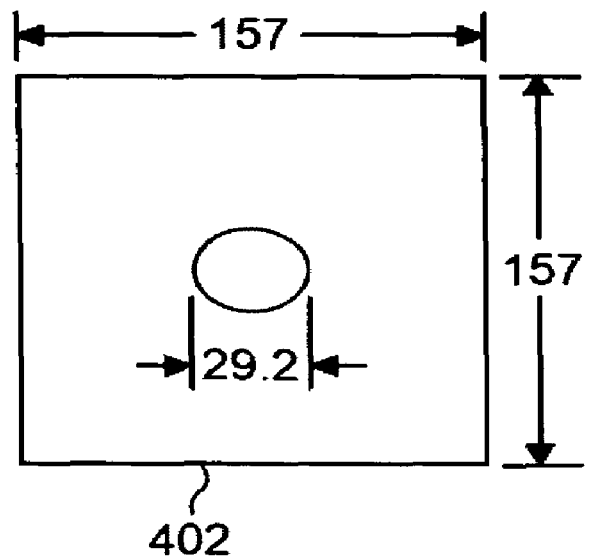

FIGS. 5A and 5B are partial cross-sectional drawings depicting dimensions for the monoblock element 302 and the coaxial extension 402, respectively, shown in FIG. 4A. Dimensions in FIGS. 5A and 5B are in mils. In both FIGS. 5A and 5B, only cross-sectional dimensions are shown. The length of the coaxial extension 402 determines the length 117 of the signal path 116. Therefore, the length of the coaxial extension 402 can be selected to obtain a signal path 116 length 117 appropriate for a desired phase shift.

Returning to FIG. 1, the signal path 116 length 117 can be selected to perform a variety of phase shifts on signals received on line 108. For example, to supply the first signal with a 90° phase shift, the signal path 116 length 117 is selected as one quarter the guided wavelength of the signal frequency on line 108. For a 180° shift, the signal path 116 length 117 is selected as one half the guided wavelength of the signal frequency on line 108. In some aspects, the filter port connected to line 112 accepts the first signal with a phase angle different than the phase angle of the first signal on line 108. Then, the signal path 116 length 117 can be selected to phase shift the signal received on line 108 such that the phase angle for the signal supplied on line 110 is equal to the phase angle of the signal accepted on line 112. It should be understood that the system 100 is not limited to the examples presented above.

Figure 6:
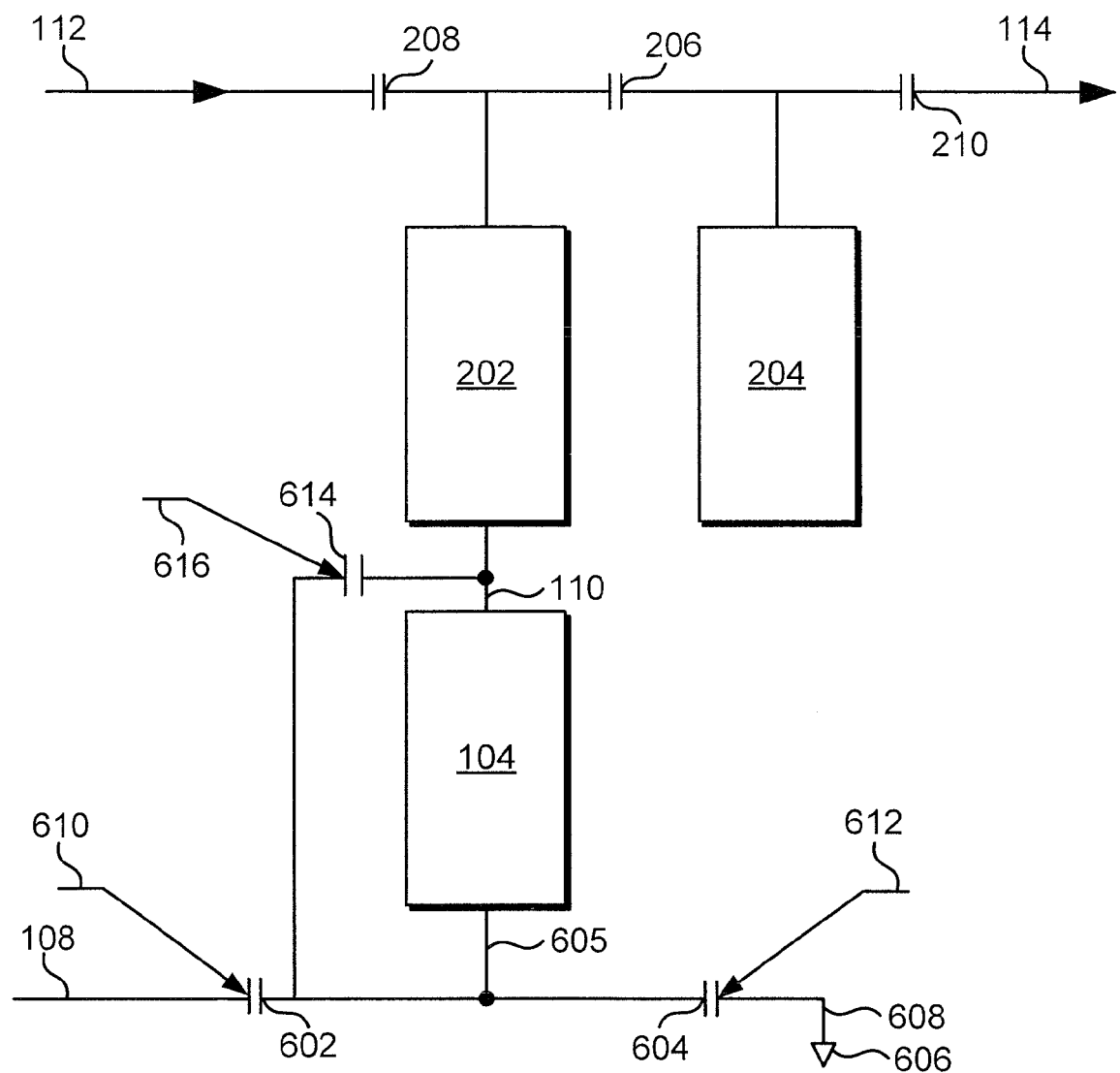
FIG. 6 is a schematic block diagram depicting the use of variable capacitors in the system.

FIG. 6 is a schematic block diagram depicting the use of variable capacitors in the system 100. FIG. 6 is based on the system 100 configuration shown in FIGS. 2A and 2B. It is understood that the use of variable capacitors in system 100 also is applicable to other system 100 configurations. In FIG. 6, system 100 includes variable capacitors 602 and 604. It should be understood that the system 100 can operate with both the capacitors 602 and 604 or with either of capacitors 602 or 604 singly. FIG. 6 is a simplified diagram used to provide a schematic understanding of the capacitor 602 and 604 operations described below. Ancillary components (not shown), such as inductors, other capacitors, and resistors may be required in the system 100 to perform the operations described below. There are many possible combinations of capacitors 602 and 604 and ancillary components and it should be understood that the system 100 is not limited to any particular combination thereof.

Capacitor 602 has a signal port connected to line 108 and a signal port connected to line 605. Capacitor 604 has a signal port connected to line 605 and a signal port connected to ground 606 on line 608. In some aspects, the capacitor 602 has a control input to accept a variable capacitance control signal (VCCS) on a control input line 610 and includes a ferroelectric material (not shown) having a dielectric constant responsive to the VCCS on the line 610. In some aspects, the capacitor 604 has a control input to accept a VCCS on line 612 and includes a ferroelectric material (not shown) having a dielectric constant responsive to the VCCS on a control input line 612. In these aspects, the capacitance of the capacitors 602 and 604 varies as the dielectric constant of the respective ferroelectric materials change in response to the VCCS on control input lines 610 and 612, respectively. VCCS is generated by systems (not shown) outside of system 100. Frequency tuning can be achieved by changing the dielectric constant of the ferroelectric materials.

Adjusting the capacitors 602 and 604 is an interactive process involving the PSDE 104, the filter 106, as well as, the capacitors 602 and 604. That is, capacitors 602 and 604, PSDE 104, and filter 106 functions are interdependent. However, by assuming the simplified interaction of capacitors 602 and 604, PSDE 104, and filter 106 in the examples that follow, the general functions of capacitors 602 and 604 can be understood.

In some aspects, the capacitor 602 can be tuned to match an impedance source (not shown) providing the signal on line 108. Changing the impedance match in response to changing input signal frequencies enables the wireless communications device 102 to accept communications signals from multiple bands, for example, North American CDMA and Korean CDMA. In some aspects, the capacitor 604 can be tuned to provide variable phase shifting in PSDE 104. For example, if the fixed phase shift performed responsive to the signal path 116 length 117 does not produce the desired phase angle for the signal supplied on line 110, capacitor 604 can be tuned to augment the fixed phase shift as needed. In some aspects, the capacitors 602 and 604 also can be singly or jointly tuned to modify the resonant frequency in filter 106.

In some aspects, the tuning of capacitors 602 and 604 is fixed. For example, capacitor 604 could be tuned to provide an additional 3° phase shift of the signal on line 108. In some aspects, the tuning of capacitors 602 and 604 is adaptive. As noted above, the capacitance of the capacitors 602 and 604, and hence, the function of capacitors 602 and 604, changes in response to a VCCS accepted on lines 610 and 612, respectively. Therefore, a VCCS on line 612 could be used to vary the amount that capacitor 604 augments the phase shift performed by PSDE 104.

In some aspects, the system 100 includes a variable capacitor 614 with a signal port connected to line 605 and a signal port connected to line 110. In some aspects, the capacitor 614 has a control input to accept a VCCS on a control input line 616 and includes a ferroelectric material (not shown) having a dielectric constant responsive to the VCCS on the control input line 616. In these aspects, the capacitance of the capacitor 614 varies as the dielectric constant of the ferroelectric material changes in response to the VCCS on the control input line 616.

Figure 7:
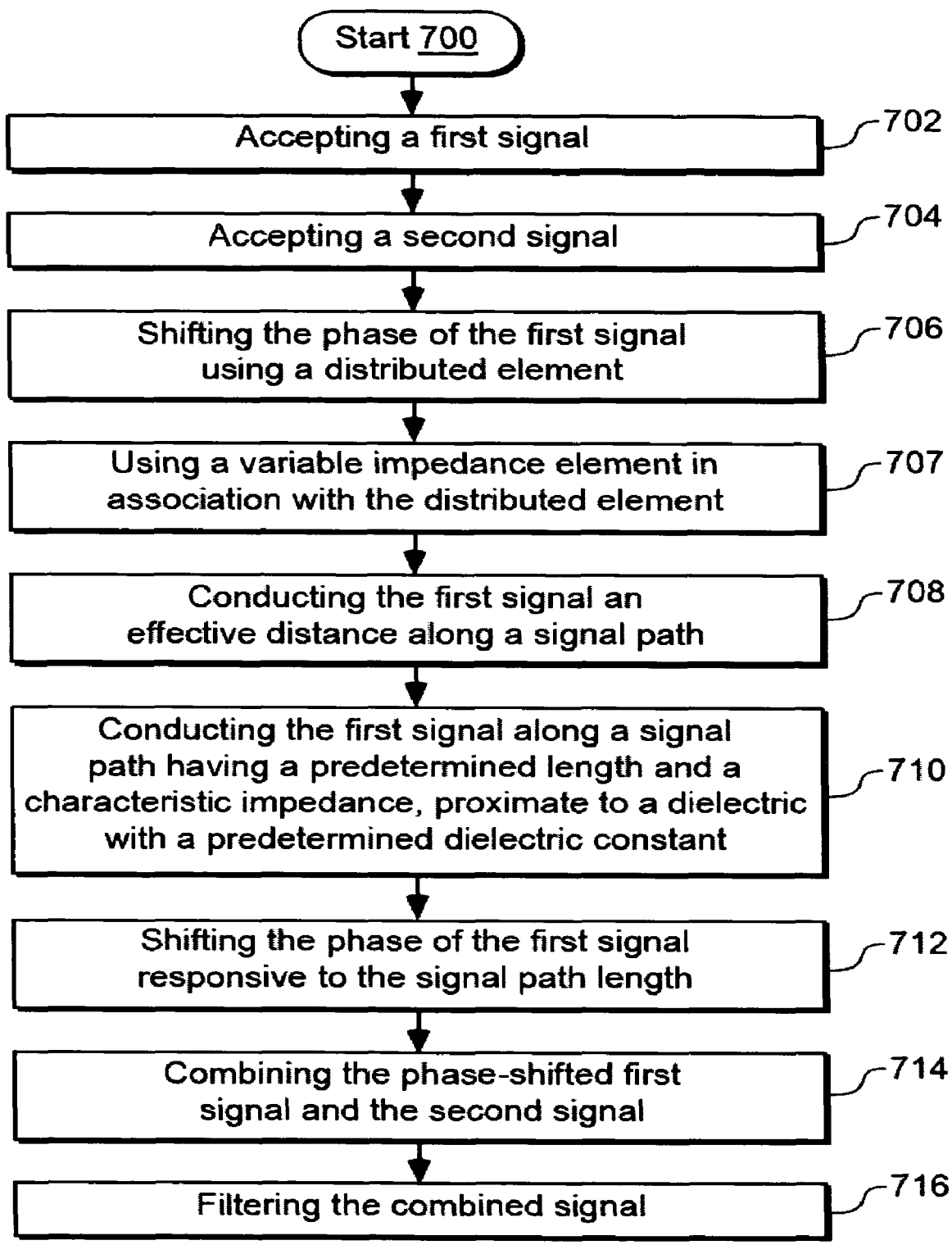
FIG. 7 is a flowchart illustrating the method for combining electrical signals.
Figure 8:
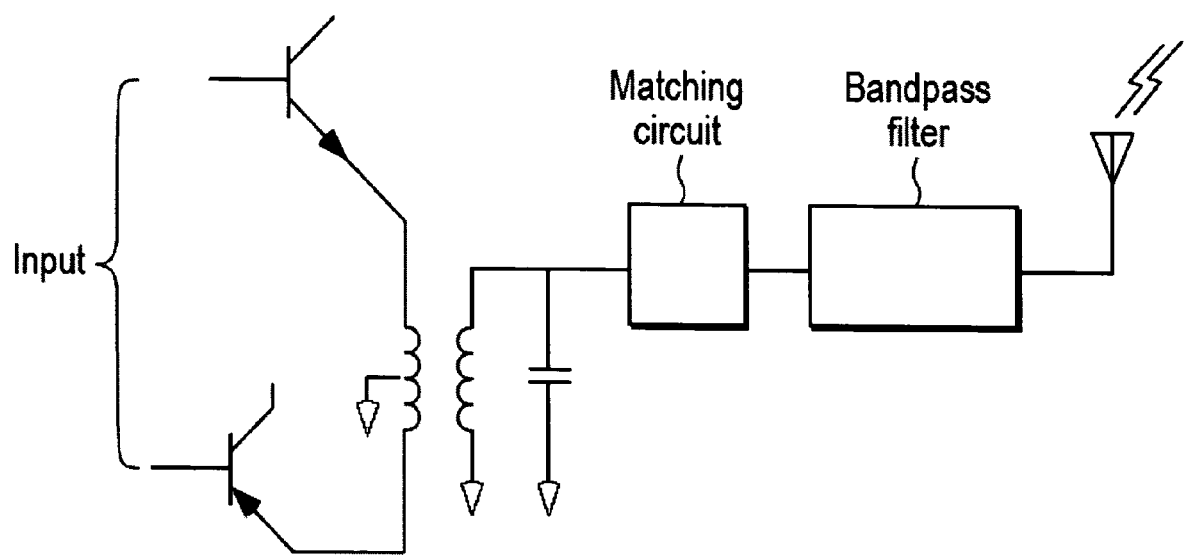
FIG. 8 is a schematic diagram of a lump element, dual input-single output system in a wireless communications device (prior art).

FIG. 7 is a flowchart illustrating the method for combining electrical signals. Although the method in FIG. 7 is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts with Step 700. Step 702 accepts a first signal. Step 704 accepts a second signal. Step 706 shifts the phase of the first signal using a distributed element. Step 708 conducts the first signal an effective distance along a signal path. Step 710 conducts the first signal along a signal path having a predetermined length and a characteristic impedance. Step 712 shifts the phase of the first signal responsive to the signal path length. Step 714 combines the phase-shifted first signal and the second signal. Step 716 filters the combined signal.

In some aspects, shifting phase in Step 706 includes using a first monoblock element in the distributed element. Then, filtering the combined signal in Step 716 includes using the first monoblock element as a filter first tank circuit resonator. In some aspects, shifting phase using a first monoblock element in the distributed element includes connecting the first monoblock element in series with a first coaxial element. In some aspects, filtering the combined signals in Step 716 includes using a second monoblock element in a filter second tank circuit resonator.

In some aspects, connecting the first monoblock element in series with a first coaxial element includes pinning together the first monoblock and coaxial elements. In some aspects, connecting the first monoblock element in series with a first coaxial element includes wire bonding the first monoblock and coaxial elements.

In some aspects, shifting phase in Step 706 includes using a second coaxial element in the distributed element. Then, filtering the combined signal in Step 716 includes using the second coaxial element as a filter first tank circuit resonator. In some aspects, using a second coaxial element in the distributed element includes connecting the second coaxial element in series with a third coaxial element. Then, filtering the combined signals in Step 716 includes using a fourth coaxial element in a filter second tank circuit resonator.

In some aspects, shifting the phase of the first signal responsive to the length in Step 712 includes shifting the phase of the first signal 180°.

In some aspects, accepting a first signal in Step 702 includes accepting a first signal with a first phase angle. Then, accepting a second signal in Step 704 includes accepting the first signal with a second phase angle different than the first phase angle. Then, shifting the phase of the first signal responsive to the length in Step 712 includes shifting the first signal a third phase angle equal to the difference between the first and second phase angles.

In some aspects, the method includes a Step 707 using a variable impedance element in association with the distributed element. Then, shifting the phase of the first signal using a distributed element in Step 706 includes variably shifting the phase of the first signal using the variable impedance element. Then, accepting a first signal in Step 702 includes impedance matching to a first signal source using the variable impedance element. Then, filtering the combined signal in Step 716 includes adjusting a resonance frequency using the variable impedance element.

In some aspects using a variable impedance element in Step 707 includes using a ferroelectric (FE) capacitor as follows: forming the FE capacitor using a FE dielectric; supplying a bias voltage to the FE dielectric; and changing the dielectric constant of the FE dielectric in response to the bias voltage.

An apparatus and a method are provided for combining electrical signals. Examples of the present invention have been enabled with a wireless communications device. However, it should be understood that the present invention is not limited to wireless communications devices, or to communications devices in general. The apparatus and method are applicable to any electrical device accepting, generating, or processing electrical signals. Other variations and embodiments of the present invention will occur to those skilled in the art.

Although the invention has been described with reference to particular embodiments, the description is only an example of the invention's application and should not be taken as a limitation. Consequently, various adaptations and combinations of features of the embodiments disclosed are within the scope of the invention as encompassed by the following claims.

We claim:

1. An apparatus for combining electrical signals, the apparatus comprising:
   a phase-shift distributed element comprising:
     a first monoblock element;
     a signal path having a predetermined length and a characteristic impedance;
     an input to accept a first signal on the signal path; and
     an output to supply the first signal with a phase shift responsive to the predetermined length of the signal path; and
   a filter for combining and filtering the first signal and a second signal, comprising:
     a first tank circuit resonator comprising the first monoblock;
     a first signal port connected to the phase-shift distributed element output;
     a second signal port to accept the second signal; and
     a third signal port to output the combined and filtered first signal and second signal.

2. The apparatus of claim 1 the predetermined length of the signal path is a fraction of a guided wavelength of the first signal.

3. The apparatus of claim 1 wherein the phase-shift distributed element includes the first monoblock element connected in series to a first coaxial element, the first monoblock and the first coaxial element interposed between the input and the output of the phase-shift distributed element.

4. The apparatus of claim 3 wherein the filter further comprises a pin connecting the first monoblock element to the first coaxial element.

5. The apparatus of claim 3 wherein the filter further comprises a wire bond connecting the first monoblock element to the first coaxial element.

6. The apparatus of claim 3 wherein the phase-shift distributed element further comprises a second coaxial element; and,
   wherein the first tank circuit resonator comprises the second coaxial element.

7. The apparatus of claim 6 wherein the filter includes a third coaxial element used as a second tank circuit resonator.

8. The apparatus of claim 1 wherein the filter further comprises a second monoblock element used as a second tank circuit resonator.

9. The apparatus of claim 1 wherein the phase-shift distributed element output supplies the first signal with a 180° phase shift.

10. The apparatus of claim 1 wherein the phase-shift distributed element input accepts the first signal with a first phase angle;
    wherein the filter second port accepts the first signal with a second phase angle different than the first phase angle; and,
    wherein the phase-shift distributed element output supplies the first signal with a third phase angle equal to the second phase angle.

11. The apparatus of claim 1 further comprising:
    a variable capacitor operatively connected to the phase-shift distributed element.

12. The apparatus of claim 11 wherein the variable capacitor has a control input to accept variable capacitance control signals and includes a ferroelectric material having a dielectric constant responsive to the variable capacitance control signals.

13. A method for combining electrical signals, the method comprising:
    accepting a first signal;
    accepting a second signal;
    conducting the first signal along a signal path in a first monoblock of a distributed element, the signal path having a predetermined length and a characteristic impedance;
    shifting the phase of the first signal responsive to the predetermined length of the signal path of the distributed element;
    combining the phase-shifted first signal and the second signal; and
    filtering the combined signal using a first tank circuit resonator, the first tank circuit resonator comprising the first monoblock.

14. The method of claim 13 wherein the distributed element further comprises a first coaxial element in series with the first monoblock.

15. The method of claim 13 wherein filtering the combined signals further comprises using a second monoblock element as a filter second tank circuit resonator.

16. The method of claim 13 wherein the first signal has a first phase angle;
   wherein the second signal has a second phase angle different than the first phase angle; and
   wherein shifting the phase of the first signal responsive to the predetermined length comprises shifting the phase of the first signal to a third phase angle equal to a difference between the first phase angle and the second phase angle.

17. The method of claim 13 further comprising variably shifting the phase of the first signal using a variable impedance element.

18. The method of claim 17 wherein the first signal is provided by a first signal source, further comprising:
   providing an impedance match to the first signal source using the variable impedance element.

19. The method of claim 17 wherein filtering the combined signal includes adjusting a resonance frequency using the variable impedance element.

20. The method of claim 17 wherein the variable impedance element is a ferroelectric (FE) capacitor comprising a ferroelectric (FE) material and connected to a bias voltage, the bias voltage for changing a dielectric constant of the FE material.

21. A device for combining electrical signals, the device comprising:
   a phase-shift distributed element (PDSE) comprising:
      a signal path having a length and a characteristic impedance;
      a PSDE input for accepting a first signal on the signal path, the first signal having a first phase angle; and
      a PSDE output for outputting the first signal with an output phase angle responsive to the length of the signal path; and
   a filter comprising:
      a first signal port connected to the PSDE output;
      a second signal port to accept a second signal, the second signal having a second phase angle different than the first phase angle, wherein the second phase angle of the second signal is equal to the output phase angle of the first signal; and
      a third signal port coupled to the first signal port and the second signal port for outputting a combined filtered signal.

22. The device of claim 21 wherein the filter further comprises a first tank circuit resonator connected between the first signal port and the second signal port.

23. The device of claim 21 wherein the PSDE further comprises a first monoblock element.

24. The device of claim 23 wherein the PSDE further comprises a first coaxial element in series with the first monoblock element.

25. The device of claim 24 wherein the first monoblock element further comprises:
   a second coaxial element connected to the first coaxial element; and
   a third coaxial element.

26. The device of claim 23 wherein the filter further comprises a first tank circuit resonator connected to the first signal port, the first tank circuit resonator having a first tank circuit inductance comprising an inductance of the first monoblock element.

27. The device of claim 21 further comprising:
   a variable impedance element for variably shifting the first phase angle of the first signal.

28. The method of claim 27 wherein the variable impedance is a ferroelectric (FE) capacitor comprising:
   a FE dielectric having a dielectric constant;
   a bias voltage supplied to the FE dielectric, wherein the dielectric constant of the FE dielectric changes in response to the bias voltage.

29. A device for combining electrical signals, the device comprising:
   a phase-shift distributed element comprising:
      a signal path having a predetermined length and a characteristic impedance;
      an input to accept a first signal on the signal path; and
      an output to supply the first signal with a phase shift responsive to the predetermined length of the signal path; and
   a filter comprising:
      a first signal port connected to the phase-shift distributed element output;
      a first tank circuit resonator comprising at least a portion of the phase-shift distributed element;
      a second signal port to accept a second signal; and
      a third signal port to supply combined and filtered first and second signals.

30. The device of claim 29 wherein the phase-shift distributed element comprises a first dielectric monoblock.

31. The device of claim 29 wherein the filter further comprises a second tank circuit resonator comprising a second portion of the phase-shift distributed element.

32. The device of claim 29 wherein the phase shift distributed element further comprises an extension monoblock connected in series with the first dielectric monoblock.

* * * * *